Jan. 7, 1969 C. W. YUNGBLUT 3,420,946
MOUNTING ADAPTER FOR ADJUSTABLE ELECTRICAL COMPONENTS
Filed Nov. 30, 1966 Sheet 1 of 2

INVENTOR.
CHARLES W. YUNGBLUT
BY
ATTORNEY

MOUNTING ADAPTER FOR ADJUSTABLE ELECTRICAL COMPONENTS

Filed Nov. 30, 1966

INVENTOR.
CHARLES W. YUNGBLUT
BY
ATTORNEY 3,420,946

MOUNTING ADAPTER FOR ADJUSTABLE ELECTRICAL COMPONENTS

Charles Walter Yungblut, Santa Ana, Calif., assignor to Beckman Instruments, Inc., a corporation of California Filed Nov. 30, 1966, Ser. No. 598,044
U.S. Cl. 174—52 6 Claims
Int. Cl. H05k *5/00;* H02b *1/04;* H01c *1/02*

The present invention relates to a mounting adapter for supporting an adjustable electrical component having pin-type terminals on a circuit board or the like and more particularly relates to an adapter for supporting the electrical component in a position to permit access to its adjustable mechanism from a position other than that ordinarily possible when the component is mounted on a circuit board without the adapter.

Electrical components and more particularly miniature electrical components such as trimmer potentiometers and trimmer capacitors are often mounted on printed circuit boards or other panel-type electrical structures by means of pin-type terminal members protruding from the component. The pin-type terminals are usually designed to protrude from the device in a regular pattern adaptable for mounting through apertures formed in a standaard circuit board. The pins are easily inserted through the board and the normal mounting position of the electrical device or component is usually in a position along the axis by which the pins protrude from the device.

Once these components are mounted and connected into an electrical circuit, they are adjustable from one particular direction by means of a screw driver or other adjusting tool. Since the printed circuit boards are frequently mounted side by side and very close together, these components need to have their adjustable mechanism conveniently positioned with respect to the available openings between the boards so that they are readily accessible for any required adjustment. For example, a device which is to be adjusted from the top, or from a direction essentially perpendicular to the panel, may not be accessible when additional panels are placed in side by side relation. The term "top-adjusted" hereinafter refers to a component which is typically positioned on a circuit board and adjusted from a direction which may be essentially parallel to the terminal pins or essentially perpendicular to the plane of the panel.

In order to provide a flexibility in the design of electrical circuits using circuit board components, it is sometimes necessary for a manufacturer to provide the same component with adjustable mechanism accessible from various sides of the component. The additional models necessary to provide adjustment from various different directions greatly increases the manufacturing costs thereof. In some instances a top adjusted component has been made side adjustable merely by bending the terminal pins in a desired direction and supporting the component in a cantilevered position on the circuit board or panel. In other arrangements the terminal pins are bent into the desired position and a molding of plastic or other insulating material is formed around the structure to hold the components in position and to support the electrical component on the board. In such an adaptation, the component may be insert-molded at the factory; but this adaptation subjects the electrical component to high molding temperatures and pressures and in the event a molding flaw develops, the whole unit must normally be scrapped.

It is an object of the present invention to provide an effective mounting adapter for positioning an electrical component on a circuit board so that its adjustment mechanism can be made accessible from a position other than the normal mounting position of the device with respect to a board.

It is another object of the invention to provide an improved mounting adapter for converting a top-adjusted electrical component to a side-adjusted electrical component when mounted on a circuit panel or the like.

It is a further object of the invention to provide a mounting adapter which may be employed in the field to adapt an electrical component for adjustment in a direction different than that available when mounted in its normal mounting position.

Further objects and advantages of the present invention will become apparent as the following description proceeds and the features of novelty which characterize the invention will be pointed out with particularity in the claims annexed to and forming part of this specification.

In carrying out the present invention there is provided in combination with an adjustable electrical component having at least one pin-type terminal extending outwardly from the component and adapted to be positioned through mounting holes of the circuit board or the like for connecting the component into an electrical circuit and normally adapted to support the component with respect to the board in a first position with an adjustable mechanism of the component accessible from a first direction, a mounting adapter for supporting the electrical component in a second position with respect to the circuit board and with the adjustable mechanism accessible from a second direction. The adapter comprises a block preferably of insulating material having a support side adapted to be positioned on the circuit board and having a recess therein adapted to receive the electricl component. The recess is open on one side thereof through which the adjustable mechanism of the component is accessible. An aperture communicating with the recess and extending through a sidewall to a second side of the mounting block is so positioned and arranged as to receive the pin-type terminal of the electrical component when inserted into the recess. A second aperture, extending from the second side of the block to another side of the block is formed in the adapter block to receive the terminal pin of the electrical component upon being substantially reversely bent along the second side of the block. The second aperture communicates with the support side of the block through the pin-type terminals may extend and be positioned substantially perpendicular to the support side of the block for insertion through the support or termination holes in the circuit board.

For a better understanding of the invention reference may be had to the accompanying drawings in which.

Figure 2:
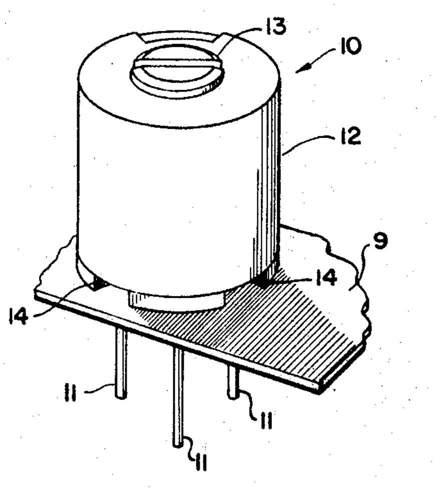
FIGURE 2 is an enlarged perspective view of a typical top-adjustable electrical component which may be suitably supported by means of the mounting adapted of the present invention.

Referring now to FIGURE 2, there is illustrated a miniature electrical component in the form of a "top-adjusted" trimming potentiometer generally designated by the reference numeral 10. The construction of the trimmer potentiometer employing the configuration of that of FIG. 2 is exemplified by the copending application of Ralph E. Mishler, Ser. No. 419,643, entitled "Miniature Trimmer Potentiometer," filed Dec. 21, 1964, and the copending application of Ralph E. Mishler Ser. No. 530,574, entitled "Variable Resistance Device" filed Feb. 28, 1966. Each of the foregoing applications is assigned to Beckman Instruments, Inc., assignee of the present invention.

In the embodiment illustrated in FIG. 2, the trimmer potentiometer comprises a generally cylindrically shaped housing 12 which encloses the active components of the resistance device. These components, although not shown, usually include a resistance element arranged around a predetermined path and supported within the housing by an insulating member and a moveable wiper adapted to traverse the resistance element upon actuation of an adjustment mechanism which is accessible externally of the housing 12. In this embodiment, the adjustment mechanism includes a rotor member 13 having a slot therein into which may be inserted a screw driver or other adjusting means for turning the rotor to a desired setting. Rotation of the rotor 13 causes the mechanism within the housing to adjust the position of the electrical components therein in order to effect the desired change in an electrical characteristic such as a change in resistance, voltage, or capacitance with respect to one or more of the terminal members 11 protruding from the electrical component.

At least one terminal member 11 is in the form of a pin-type terminal protruding outwardly along the axis of the terminal which passes through the body of the electrical component. The terminal pin serves to connect the component into an electrical circuit and to support the component on a circuit board, such as the board 9, shown in FIG. 2, with the body of the component preferably positioned substantially above the mounting holes of the circuit board. The trimmer of FIG. 2 includes pin-type terminals 11 which extend into or through the circuit board 9 so that the underside of the trimmer is positioned against the board. In order to support the device slightly above the circuit board and, to prevent solder damage during the connection of the terminal pins 11, there is normally employed a standoff member such as member 14, made of a high heat-resistant insulating material, such as a molded phenolic plastic. The position of the trimmer potentiometer in FIG. 2 represents the normal mounting position of this device and, as may be seen in FIG. 2, adjustment of the device may be made only from the top of the device in a direction parallel to the axis of the terminal pins 11 as they are positioned through the board 9, or alternatively, in a direction perpendicular to the plane of the board 9.

Figure 1:
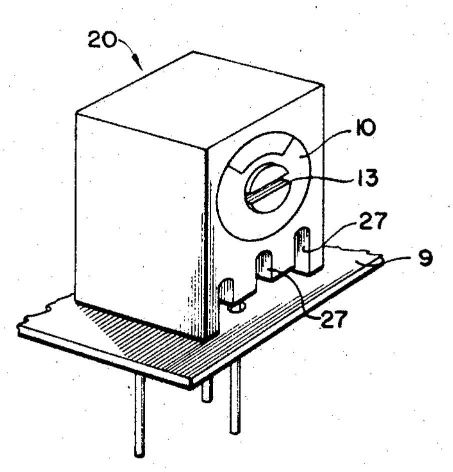
FIGURE 1 is an enlarged perspective view of the mounting adapter of the present invention having a pin-type adjustable electrical component supported thereon above a circuit board.

Referring now to FIGURE 1, there is shown a mounting adapter, generally designated by the reference numeral 20, for adapting an electrical component, such as the miniature trimmer of FIG. 2, to be mounted in a position other than its normal mounting position so that it may be made accessible for adjustment from a direction other than that normally available for such component. In the illustrated embodiment, the mounting adapter is in the form of a molded block 20 and is preferably formed of an insulating material such as a glass-filled nylon or other suitable non-conductive material. In the embodiment shown in FIG. 1, the block supports the miniature electrical component in a position so that it is accessible from a direction substantially 90° from that of its original mounting position. In effect, the adapter makes the component essentially a "side mounted" device.

Referring now to FIGS. 3–9, the adapter is preferably formed in the shape of a cube, the lower face of which serves as a mounting surface and which may be provided with integral support shoulders or stand-off surfaces 21. The stand-off surfaces provide a space between the bottom surface of the cube and the surface of the board or panel on which the unit is to be mounted. The space permits washing or flushing beneath the mounting adapter after the pin terminals are soldered.

Figure 4:
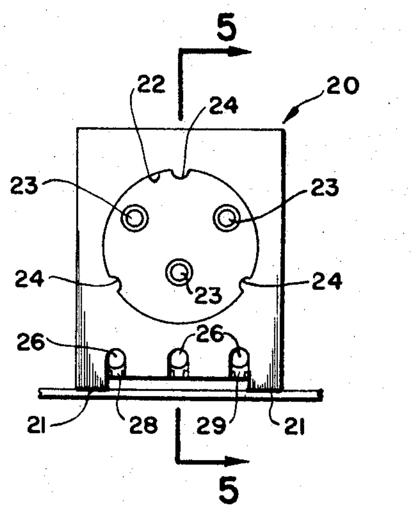
FIGURE 4 is an enlarged front view of the adapter looking into the cavity formed therein.

In the illustrated embodiment, the block is provided with a cylindrically-shaped cavity or recess 22 open on one side. It will be understood that the block and the cavity may have any desired shape such as square, round, or rectangular, the shape of the cavity being largely dependent upon the shape of the electrical component. In the illustrated embodiment, the cavity is cylindrical and accepts the cylindrical shaped body of the miniature trimmer. As may best be seen in FIGURE 4, the surface of the cavity is provided with 3 longitudinal ribs 24 which are located within the cavity 22 to coincide with the recessed sections of the stand-off member 14 on the miniature trimmer (of FIG. 2). These ribs 24 insure smooth trimmer entry into the cavity 22 and may provide an interference fit with the outside diameter of the housing 12 of the trimmer potentiometer to hold the trimmer securely in place once it is placed into the cavity. The ribs 24 can be formed to assure a suitable fit. Of course, the ribs 24 in the adapter and tabs (not shown), formed on the electrical component may be other than as illustrated in FIG. 4, or may not be employed at all. The above ribs 24 illustrate, however, the manner in which the cavity can be formed to conform to the shape of the electrical component.

Figure 3:
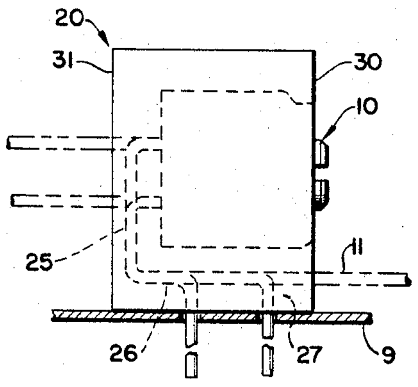
FIGURE 3 is an enlarged side view of the adapter showing in phantom and dotted lines the various positions of the terminal pins during assembly of the component into the adapter.

As may be seen in FIGS. 1 and 3, when the miniature trimmer is inserted within the cavity 22, the adjustment mechanism or rotor head and slot 13 are accessible from the direction of the opening of the recess or cavity in the mounting adapter. This side 30 of the adapter shall hereinafter be considered and referred to as the front side of the adapter.

When the electrical component is inserted into the cavity each of the terminal pins 11 is positioned into an aperture 23 which extends through the sidewall of the block and emerges on a second side 31 of the block. As will be seen in FIG. 4, the apertures 23 are chamfered to facilitate pin insertion. When first inserted through the apertures 23, the terminal pins extend outwardly along the original axis of the pins, as shown in phantom lines in FIG. 3. The pin-type terminals are then substantially reversely bent along the second side or (in this instance) the rear side 31 of the adapter block 20 and are reinserted into second apertures designated 26. Second apertures 26 extend from the second surface or side of the adapter block toward another side which, in the preferred embodiment, is the front side of the adapter block. (This may best be seen in FIGS. 5 and 6.)

Figure 5:
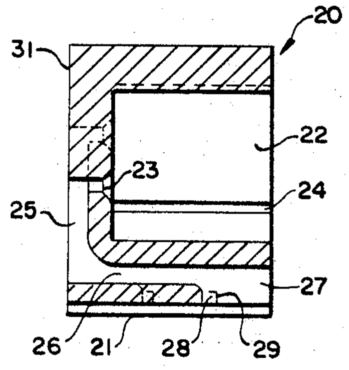
FIGURE 5 is a cross-sectional view taken essentially along the line 5—5 of FIG. 4.
Figure 6:
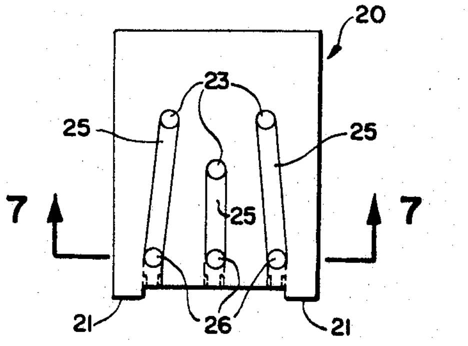
FIGURE 6 is a rear view of the adapter illustrating slots connecting the first and second apertures according to a preferred embodiment of the invention.
Figure 7:
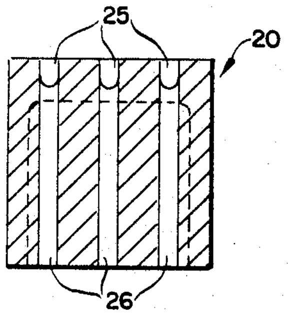
FIGURE 7 is an enlarged cross-sectional view taken essentially along line 7—7 of FIG. 6.
Figure 8:
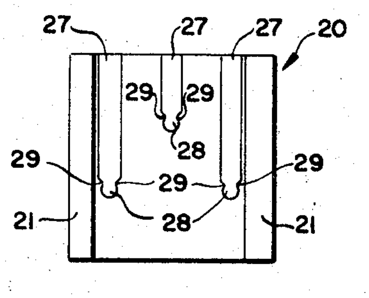
FIGURE 8 is a bottom view illustrating the mounting surface of the adapter and showing slots through the bottom surface communicating with the second apertures, in accordance with the preferred embodiment of the invention.

As may be seen in FIGS. 5, 6, and 7, each aperture 23 is preferably joined to the second aperture 26 by means of a groove 25 formed in the rear or second side 31 of the adapter block. Upon being reversely bent, the pin-type terminals 11 extend longitudinally along the apertures 26 and extend out the front face or surface of the adapter block, as shown in phantom lines in FIG. 3. When the terminal pins 11 are reversely bent and inserted through the apertures 26, they are preferably pulled tight so that they lie directly adjacent the rear surface 31 of the block or are pulled into the grooves 25, if provided.

Terminals 11 are again bent substantially at 90° into slots or openings 27, communicating between the apertures 26 and the support side of the block. Slots 27 are formed through the bottom side of the block 20 and provide openings between apertures 26 and the lower mounting surface of the block. In the preferred embodiment, certain slots 27 may be of greater or lesser length than adjacent slots to permit the pins to protrude in a staggered, triangular formation or other desired pattern from the lower surface of the block 20. The variation in length of the slots communicating between the apertures 26 and the lower surface of the block 27 may best be seen in FIGURE 8. Terminal pins 11 then protrude from the support surface of the adapter member for insertion through mounting holes of a circuit board or the like, as shown in FIG. 3.

In the preferred form, there is provided a terminal pin area 28 for securely retaining each terminal pin after it is bent downwardly through its respective slot 27. This may best be seen in FIG. 9. The pin retaining area 28 has 2 projections 29 extending inwardly from opposite sides of the slots 27 to provide a gap therebetween which is smaller than the diameter of the terminal pin 11. Due to the resilient nature of the material from which the mounting adapter block is formed, the projections 29 temporarily deform as the pins 11 pass between and then spring back to their original shape when the pin reaches the retaining area 28. The retaining areas 28 assure positive pin positioning as well as adequate support of the adapter mount and its retained electrical component in position above a printed circuit board or the like.

In the preferred form, an insulating tape or any epoxy filler material may be applied to the back surface of the block to fill the grooves 25 or to cover the terminal pins extending along the rear side of the block and prevent voltage breakdown when such terminals are assembled close to another electrical object on a circuit board. It will be observed that slots 25, themselves, also serve to insulate the respective pin members from each other and tend to eliminate voltage breakdown.

Figure 10:
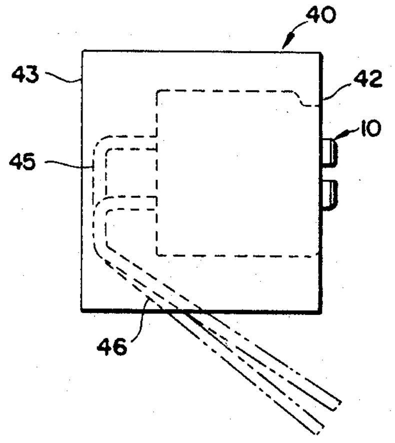
FIGURE 10 is a greatly enlarged side elevation view illustrating another embodiment of the invention.
Figure 9:
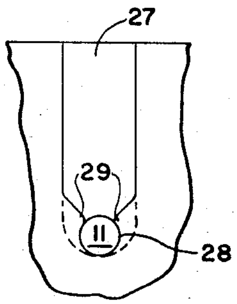
FIGURE 9 is a greatly enlarged, partial bottom view showing a terminal pin within its retaining area.

As may be seen in FIG. 10, there is provided a second embodiment of the invention in which the mounting adapter is denoted by the reference numeral 40. In this embodiment of the invention, the adapter again supports a top-adjustabe component so that access may be had to the adjustable mechanism from the side. As may be seen in FIG. 10, the second apertures 46 are not arranged parallel to the lower surface or mounting surface of the adapter. Instead, they are angled from the rear surface or second side 43 and emerge directly on the lower or mounting surface of the block. By this arrangement, the slots 27 are eliminated and the terminal pins 11 extend directly out the lower surface of the block. The pins are then preferably bent at an angle normal to the lower surface of the adapter for mounting the pins through the holes of a circuit board in the same manner as the first embodiment. While this embodiment eliminates the requirement for molding slot 27 into the lower portion of the block, it is not considered as strong as the arrangement first disclosed in FIGURES 3–9. In both embodiments, the second apertures 26 and 46 are insulated from the housing of the electrical component within the cavity by a portion of the insulated block so that there is no danger of shorting out the electrical components when the terminal pins are substantially reversely bent along the housing of the electrical component.

While in accordance with the patent statutes there has been described what at present is considered to be the preferred embodiments of the invention, it will be obvious to those skilled in the art that various changes and modifications may be made therein without departing from the invention and it is, therefore, the aim of the appended claims to cover all such changes and modifications as fall within the true spirit and scope of the invention.

What is claimed is:

1. In combination with an adjustable electrical component having at least one pin-type terminal extending outwardly from said component in one direction and adapted to be positioned through mounting holes of a circuit board or the like for connecting said component into an electrical circuit and supporting said component with respect to said circuit board in a first position with an adjustable mechanism of said component accessible from a first direction, a mounting adapter for supporting said electrical component in a second position with respect to said circuit board so that said adjustable mechanism is accessible from a second direction comprising:

a block of insulating material having a support surface and having a recess therein opening toward one side thereof and adapted to receive said electrical component therein with said adjustable mechanism exposed through said opening;

an aperture communicating with said recess and extending through a sidewall of said block to a second side thereof, said aperture being so positioned and arranged as to receive the pin-type terminal of the electrical component when inserted into said recess;

a second aperture adapted to receive the pin-type terminal of the electrical component upon said terminal being substantially reversely bent along said second side of said block, said second aperture extending from said second side of said block to another side of said block and being insulated from said recess by a portion of said block; and an opening communicating with said second aperture and emerging at said support side of said block through which said pin-type terminal is positioned substantially perpendicular to said support side of said block for insertion through mounting holes in a circuit board.

2. A mounting adapter for supporting on a circuit board or the like, an electrical component having at least one pin-type terminal extending outwardly therefrom and having an adjustable mechanism accessible from one direction for varying an electrical characteristic of said component, comprising:

a block of insulating material having a support surface and having a recess therein opening toward a side of said block disposed at an angle with respect to said support surface, said recess having a shape adapted to receive said electrical component therein with said adjustable mechanism exposed through said opening;

first aperture communicating with said recess and extending through a sidewall of said block to a second side thereof, said aperture being so positioned and arranged as to receive the pin-type terminal of the electrical component when said component is inserted into said recess;

a second aperture adapted to receive the pin-type terminal of the electrical component upon said terminal being substantially reversely bent along said second side of said block, said second aperture extending from said second side of said block to another side of said block and being insulated from said recess by a portion of said block; and means communicating with said second aperture and an opening at said support side of said block through which said pin-type terminal is positioned substantially perpendicular to said support side of said block for insertion through mounting holes in a circuit board or the like.

3. A mounting adapter as defined in claim 2 wherein said second aperture is disposed through said block substantially parallel to said first aperture and emerges on said one side of said block and said means communicating with said second aperture and opening at said support surface comprises a slot extending from the first side of said block said slot adapted to permit said pin-type terminals to be bent substantially 90° with respect to said second aperture to be positioned substantially perpendicular to said support side of said block for insertion through mounting holes in a circuit board.

4. The mounting adapter defined in claim 3 wherein resilient retaining shoulders are formed in said slots to receive said pin-type terminal and retain it within said slot when bent at an angle with respect to said second aperture.

5. The mounting adapter defined in claim 2 wherein said second side of said block includes grooves communicating between said first and second apertures for receiving said terminal pin when said terminal pin is reversely bent along said second side of said block.

6. In combination with a top-adjustable electrical component having a plurality of pin-type terminals extending outwardly from said component in one direction and adapted to be positioned through mounting holes of a circuit board or the like for connecting said component into an electrical circuit and normally supporting said component with respect to said circuit board in a first position so that an adjustable mechanism of said component is accessible from a direction perpendicular to said circuit board, a mounting adapter for supporting said top-adjustable electrical component in a second position with respect to said circuit board so that said adjustable mechanism is accessible from a direction parallel to the plane of said circuit board comprising:

a substantially cube-shaped block of insulating material having a support surface and having a recess therein opening toward a front side thereof disposed substantially 90° from said support surface, said recess adapted to receive said top-adjustable electrical component therein with said adjustable mechanism exposed through said opening in said front side;

a plurality of apertures communicating with said recess and extending through a sidewall of said block to the rear side thereof, said apertures being so positioned and arranged as to receive the pin-type terminals of the electrical component when said component is inserted into said recess;

a plurality of second apertures adapted to receive each of said pin-type terminals of said electrical component upon said pin-type terminal being substantially reversely bent along said rear side of said block, said second apertures extending substantially parallel to said first apertures from said rear side of said block to said support surface of said block, said second apertures being insulated from said recess by a portion of said block; and a plurality of slots formed in said support surface and communicating with said second apertures from the front side of said block a distance toward said rear side thereof through which said pin-type terminals are positioned substantially perpendicular to said second apertures and said support side of said block for insertion through mounting holes in a circuit board or the like.

References Cited

UNITED STATES PATENTS

| | | | |
|---|---|---|---|
| 2,869,104 | 1/1959 | Pleak | 174—138.5 X |
| 3,061,762 | 10/1962 | Schlegel | 174—68.5 X |
| 3,154,631 | 10/1964 | LeMauviel | 174—52.6 |

DARRELL L. CLAY, *Primary Examiner.*

U.S. Cl. X.R.

317—101; 338—197; 339—154